(12) United States Patent
Wade

(10) Patent No.: US 8,316,725 B2
(45) Date of Patent: Nov. 27, 2012

(54) FORCE SENSOR

(75) Inventor: Richard Wade, Worthington, OH (US)

(73) Assignee: Honeywell International Inc., Morristown, NJ (US)

( * ) Notice: Subject to any disclaimer, the term of this patent is extended or adjusted under 35 U.S.C. 154(b) by 44 days.

(21) Appl. No.: 12/969,426

(22) Filed: Dec. 15, 2010

(65) Prior Publication Data

US 2012/0152037 A1   Jun. 21, 2012

(51) Int. Cl.
*G01L 1/04* (2006.01)

(52) U.S. Cl. .................................. 73/862.627; 73/760

(58) Field of Classification Search .................... 73/760, 73/862.381, 862.627
See application file for complete search history.

(56) References Cited

U.S. PATENT DOCUMENTS

| | | | |
|---|---|---|---|
| 4,155,325 A * | 5/1979 | Yu | 116/34 R |
| 4,265,164 A * | 5/1981 | Maeda et al. | 91/417 R |
| 4,645,965 A * | 2/1987 | Paganelli | 310/338 |
| 5,184,107 A | 2/1993 | Maurer | |
| 5,187,985 A | 2/1993 | Nelson | |
| 5,223,776 A | 6/1993 | Radke et al. | |
| 5,303,593 A | 4/1994 | Kremidas | |
| 5,499,041 A * | 3/1996 | Brandenburg et al. | 345/174 |
| 5,661,245 A | 8/1997 | Svoboda et al. | |
| 5,744,726 A | 4/1998 | Maurer | |
| 5,760,313 A | 6/1998 | Guentner et al. | |
| 5,996,419 A | 12/1999 | Sokn | |
| 5,999,084 A * | 12/1999 | Armstrong | 338/114 |
| 6,255,728 B1 | 7/2001 | Nasiri et al. | |
| 6,311,561 B1 | 11/2001 | Bang et al. | |
| 6,343,991 B1 * | 2/2002 | Armstrong | 463/37 |
| 6,351,996 B1 | 3/2002 | Nasiri et al. | |

(Continued)

FOREIGN PATENT DOCUMENTS

EP   0091282   3/1983

(Continued)

OTHER PUBLICATIONS http://www.gesilicones.com/siliconesweb/am1/en/documents datasheets;1838.html, "Momentive Performance Materials," 5 pages, printed Nov. 19, 2008.

(Continued)

*Primary Examiner* — Max Noori
(74) *Attorney, Agent, or Firm* — Seager, Tufte & Wickhem LLC

(57) ABSTRACT

A force sensor is disclosed. In one illustrative embodiment, the force sensor may include a sensing die mounted to a substrate and an actuation assembly for transmitting an external force to the sensing die. The sensing die may include a diaphragm and one or more sensing elements (e.g. piezoresistive elements) positioned on the diaphragm. The actuation assembly may include a spherical member or object (e.g. ball bearing) in contact with the diaphragm, a pin member having a first end coupled to the spherical object and a second end coupled to a button member. The actuator assembly may transmit a force applied to the button member to the diaphragm via the pin member and spherical member. In some cases, the front side of the sensing die may be mounted to the substrate with an adhesive, such as a pattern of conductive adhesive and nonconductive adhesive to electrically connect one or more bond pads of the sensing die to one or more bond pads of the substrate without the need for wire bonds. The force sensor may also include signal conditioning circuitry.

22 Claims, 6 Drawing Sheets

U.S. PATENT DOCUMENTS

| | | | |
|---|---|---|---|
| 6,481,286 B1 | 11/2002 | Bernstein et al. | |
| 6,489,668 B1 | 12/2002 | Oda et al. | |
| 6,601,455 B2 | 8/2003 | Kurtz et al. | |
| 6,705,166 B2 | 3/2004 | Leonardson | |
| 6,712,778 B1 | 3/2004 | Jeffcoat et al. | |
| 6,736,015 B1 | 5/2004 | Repperberger et al. | |
| 6,874,377 B2 | 4/2005 | Karbassi et al. | |
| 6,907,789 B2 | 6/2005 | Bodin | |
| 7,287,432 B2 | 10/2007 | Schnaare et al. | |
| 7,360,438 B2 | 4/2008 | Gaines | |
| 7,404,338 B2 | 7/2008 | Hierold et al. | |
| 7,462,919 B2 | 12/2008 | Engling et al. | |
| 7,726,197 B2 | 6/2010 | Selvan et al. | |
| 7,775,126 B2 | 8/2010 | Eckhardt et al. | |
| 7,775,127 B2 | 8/2010 | Wade | |
| 2003/0080721 A1* | 5/2003 | Lee | 324/71.1 |
| 2007/0251328 A1 | 11/2007 | Selvan et al. | |
| 2009/0263062 A1 | 10/2009 | Smith et al. | |
| 2011/0000313 A1 | 1/2011 | Eckhardt et al. | |
| 2011/0000318 A1* | 1/2011 | Bradley et al. | 73/862.68 |

FOREIGN PATENT DOCUMENTS

| | | |
|---|---|---|
| EP | 0354366 | 11/1992 |
| EP | 1519173 | 3/2005 |
| EP | 2110569 | 10/2009 |
| WO | 02103369 | 12/2002 |
| WO | 2007127738 | 11/2007 |
| WO | 2010048040 | 4/2010 |

OTHER PUBLICATIONS

Honeywell, "Airflow, Force, and Pressure Sensors, Product Range Guide," 20 pages, Nov. 2010.
Honeywell, "Force Sensors Line Guide," 4 pages, Jun. 2009.
Honeywell, "Pressure Sensors FS01/FS03 Force Sensors," 4 pages, 2003.
Honeywell, "TruStability Silicon Pressure Sensors: HSC Series-High Accuracy," 12 pages, Jul. 2010.
Honeywell, "TruStability Silicon Pressure Sensors: SSC Series-Standard Accuracy," 12 pages, Jul. 2010.
European Search Report, Application No. 11193330.5-1236, Apr. 4, 2012.

* cited by examiner

FORCE SENSOR

FIELD

The present disclosure relates generally to sensors, and more particularly, to force sensors for sensing a force applied to the sensors.

BACKGROUND

Force sensors are often used to sense an external force applied to the sensors and provide an output signal representative of the applied force. Such sensors can be used in a wide variety of applications, including medical applications. Example medical applications include use in medical equipment control of, for example, kidney dialysis machines, drug delivery systems, hematology equipment, infusion pumps, entrial feeders, ventilation equipment, as well as other medical equipment. Force sensors are also commonly used in non-medical applications.

SUMMARY

The present disclosure relates generally to sensors, and more particularly, to force sensors for sensing a force applied to the sensors. In one illustrative embodiment, a force sensor includes a sensing die mounted to a substrate, and an actuation assembly for transmitting an external force to the sensing die. The sensing die may include a diaphragm and one or more sensing elements (e.g. piezoresistive elements) positioned on the diaphragm. The actuation assembly may include a spherical or other shaped member or object, such as a ball bearing, in contact with the diaphragm, a pin member having a first end coupled to the spherical object and a second end coupled to a button member. The actuator assembly may be configured to transmit a force applied to the button member to the diaphragm via the pin member and spherical (or other shaped) member. In some cases, only part of the outside surface of the spherical member is spherical in shape. Also, in some cases, the force sensor may also include a housing member positioned on the substrate. The housing member may define a cavity around the sensing die and include an opening sized to receive the pin member therethrough.

In some embodiments, the front side of the sensing die (side with the sensing elements formed thereon) may be mounted toward the substrate, sometimes using an adhesive. In some instances, the adhesive may include a pattern of electrically conductive adhesive and nonconductive adhesive to selectively electrically connect bond pads of the sensing die to bond pads on the substrate. In this instance, wire bonds may not be needed to electrically connect the sensing die to the substrate, which may help increase the reliability and/or durability of the force sensor.

In some cases, the force sensor may also include signal conditioning circuitry mounted on the substrate in electrical communication with the sensing die. The signal conditioning circuitry may be configured to receive one or more electrical signals from the sensing die, and condition the signals to provide a conditioned output signal from the force sensor.

An illustrative method of manufacturing a force sensor is also disclosed. An illustrative method may include flip chip mounting a front side of a sensing die to a first side of a substrate, wherein the sensing die includes a diaphragm and one or more sensing elements. The method may also include providing an actuation assembly in contact with a back side of the diaphragm (e.g. the side of the sensing die that was etched to form the diaphragm), wherein the actuation assembly is configured to transmit an external force to the diaphragm. The actuation assembly may include a spherical member in contact with the back side of diaphragm, a pin member having a first end engaging the spherical member, and a button member engaging a second end of the pin member. In some cases, the method may also include positioning a housing member on the first side of the substrate to define a first cavity around the sensing die and the spherical member, wherein the pin member is configured to extend out through an opening in the housing member. The method may also include mounting signal conditioning circuitry to the substrate in electrical communication with the sensing die, wherein the signal conditioning circuitry may be configured to receive an electrical signal from the sensing die and condition the signal to provide a conditioned output signal from the force sensor.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION

The disclosure may be more completely understood in consideration of the following detailed description of various illustrative embodiments of the disclosure in connection with the accompanying drawings, in which.

DESCRIPTION

Figure 1:
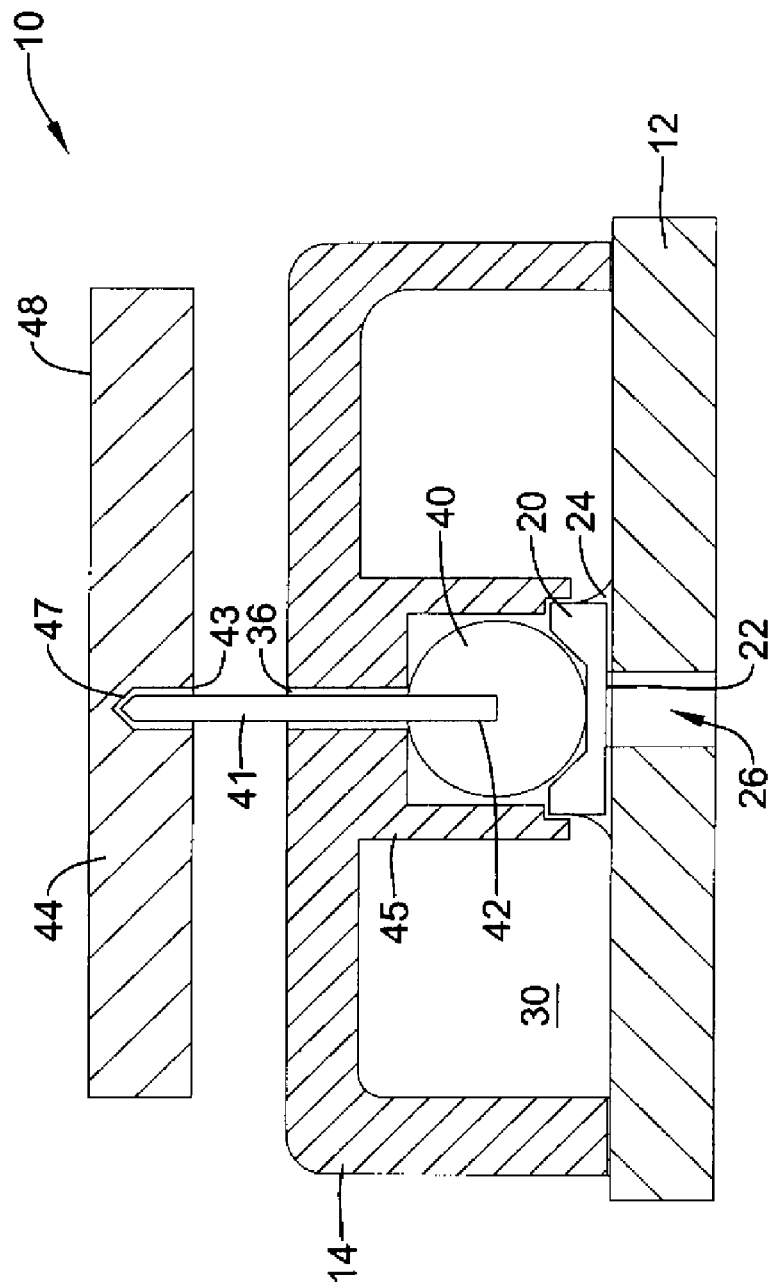
FIG. 1 is a cross-sectional schematic view of an illustrative force sensor.

The following description should be read with reference to the drawings wherein like reference numerals indicate like elements throughout the several views. The detailed description and drawings show several embodiments which are meant to be illustrative of the disclosure.

FIG. 1 is a cross-sectional view of an illustrative embodiment of a force sensor 10. In the illustrative embodiment, the force sensor 10 includes a sense element or sensing die 20 mounted to a package substrate 12 using an adhesive 24, solder or the like. In some embodiments, the sensing die 20 may be a micromechanical sensor element fabricated using a silicon wafer and suitable fabrication techniques. In this example, the sensing die 20 may have one or more sensing elements, such as piezoresistive sensing components, and/or other circuitry (e.g. trim circuitry, signal conditioning circuitry, etc.) formed using suitable fabrication or printing techniques. In some cases, the sensing die 20 may include a sensing diaphragm 22 including the one or more sensing elements formed thereon for sensing a deflection of the sensing diaphragm 22. In some cases, the sensing diaphragm 22 may be fabricated by back-side etching a silicon die, however, any suitable process may be used as desired.

When provided, the piezoresistive components may be configured to have an electrical resistance that varies according to an applied mechanical stress (e.g. deflection of sensing diaphragm 22). In some cases, the piezoresistive components may include a silicon piezoresistive material; however, other it is contemplated that non-silicon materials may be used if desired. The piezoresistive components may be connected in a Wheatstone bridge configuration (full or half bridge). It is to be understood that the piezoresistive components are only one example of a sensing element that can be used, and it is contemplated that any other suitable sensing elements may be used, as desired.

In the illustrative embodiment, the package substrate 12 may include a ceramic material, however, it is contemplated that other suitable materials may be used as desired (e.g. PCB). In some cases, the sensing die 20 may be mounted to the substrate 12 using an adhesive 24 such as a silicone, RTV, a silicone-epoxy, a soft epoxy, or a regular or hard epoxy. In some embodiments, the adhesive 24 may include a conductive adhesive, a nonconductive adhesive, or a combination of conductive and nonconductive adhesives. When provided, the combination of conductive and nonconductive adhesive may be provided in a pattern to electrically connect bond pads of the sensing die 20 to bond pads on the substrate 12. In any event, it is contemplated that the sensing die 20 may be mounted to the substrate 12 using any other suitable bonding mechanism (e.g. solder, eutectic, etc.).

As shown in FIG. 1, the sensing die 20 may be directly mounted to the substrate 12 with adhesive 24 with no intervening isolation layer(s) or substrate provided therebetween, but this is not required. In some instances, an isolation layer or glass substrate (not shown) may be provided in force sensor 10 between the sensing die 20 and the substrate 12, if desired. In some embodiments, the sensing die 20 may include a silicon material and the package substrate 12 may include an alumina ceramic, which may have similar temperature expansion coefficients. The sensing die 20 and package substrate 12, however, may be made of other suitable materials, if desired.

In some cases, the sensing die 20 may be mounted over an opening 26 in the package substrate 12 that is sized to expose the sensing diaphragm 22 to the bottom side of the package substrate 12. In this instance, the back side of force sensor 10 may have a reference pressure that can be transmitted to the sensing diaphragm 22 via opening 24, but this is not required.

In the illustrative embodiment of FIG. 1, the sensing die 20 is flip chip mounted to the substrate 12, using an adhesive 24 as a bonding material. In other words, the top side of the sensing die 20 (i.e. the side of the sensing die 20 with the sensing elements) is shown facing downward (in the orientation shown in FIG. 1) toward to the top side (in the orientation shown in FIG. 1) of the substrate 12, and mounted thereto with adhesive 24. In this example, the adhesive 24 (e.g. a combination of conductive and nonconductive adhesive) may be configured to electrically connect bond pads of the sensing die 20 to one or more bond pads or trace conductors on the substrate 12 without the need for wire bonds. In another example, the sensing die 20 may be flip chip mounted to the substrate 12 using bump bonds, a solder ball grid array, or any other suitable technique, as desired. In some cases, it is contemplated that the back-side of the sensing die 20 (i.e. the side of the sensing die 20 etched to form the diaphragm 22) may be mounted to the substrate 12 with adhesive 24. In this instance, wire bonds (not shown) may be provided to electrically connect bond pads on the top side of the sensing die 20 to bond pads on the substrate 12, if desired.

In the illustrative embodiment, the force sensor 10 may also include an actuation assembly for transmitting an external force to the sensing die 20. As shown in FIG. 1, the actuation assembly may include a spherical (or other shaped) object 40, an extender 41, and a button 44. It can be appreciated that other types of actuators may be utilized such as, for example, slidable mounted plungers or shafts, point contact type components other than spherical objects, "T" shaped transfer mechanisms, in accordance with alternative embodiments. In some cases, only part of the outside surface of the object 40 may be spherical in shape.

In the illustrative embodiment shown in FIG. 1, the spherical object 40 may include stainless steel or other suitable metal. In some instances, the spherical object 40 may be a ball bearing. However, it is contemplated that other generally spherical elements may be used, if desired, including polymer based objects. As shown in FIG. 1, the spherical object 40 may be in contact with the sensing diaphragm 22 of the sensing die 20. The extender 41, or pin, may be configured to include a first end 42 and a second end 43, with a length extending therebetween. The first end 42 of the extender 41 may engage, and in some cases may be secured or attached to, the spherical object 40 in any suitable manner including, for example, soldering or adhesively securing end 42 to the spherical object 40, press fitting end 42 into a hole formed in the spherical object 40, or any other suitable manner of securing end 42 to the spherical object 40. In some cases, the first end 42 of extender 41 may be generally conical shaped or otherwise pointed and may engage an opening in the spherical object 41. However, it is contemplated that end 42 may be flat or have another shape, as desired. While spherical object 40 and extender 41 are shown as separate members, it is contemplated that the spherical object 40 and the extender 41 may be integrally formed.

As shown in FIG. 1, button 44 may be engaged or otherwise secured to the second end 43 of extender 41. For example, the second end 43 of the extender 41, which may be generally conical shaped, may be inserted into an opening 47 of the button 44 and secured therein in any suitable manner. However, it is contemplated that end 42 may be flat or have another shape, as desired. When generally conical shaped, the button 44 may be able to swivel with respect to the second end 43 of the extender 41, which may help increase the repeatability of the force sensor 10 regardless of the orientation of the applied force. This may also be present when the first end 42 of the extender 41 is spherical shaped. Also, for example, the second end 43 of pin 41 may be secured using an adhesive, solder, welding, press fitting, or any other suitable technique. As shown, the button 44 may have a surface 48 opposite the sensing die 20 that may be configured to receive a force. In some cases, surface 48 may be generally flat or planar, however, it is contemplated that in other embodiments, surface 48 may be curved (e.g. concave or convex) or may be formed to include other surface features for engaging a force transmitting object. For example, surface 48 of button 44 may be contoured to engage a flexible tube, such as tubes used in the medical industry.

In the illustrative embodiment of FIG. 1, a protective housing 14, or cover, of the force sensor 10 may be provided. The protective housing 14 may define a cavity generally shown at 30 for housing the sensing die 20. As illustrated, the protective housing 14 is disposed on a top side (in the orientation shown in FIG. 1) of the substrate 12. With such a configuration, the protective housing 14 may help protect the sensing element of sensing die 20. In some cases, the protective housing 14 may be formed from, for example, plastic, polyamide, ceramic, or any other suitable material. Although not shown, it is contemplated that a bottom protective housing (not shown) may be provided on the bottom surface of the substrate 12, if desired. When so provided, the bottom protective housing may define a cavity defining a reference pressure for the sensing diaphragm, or may include a pressure opening for exposing the sensing element (e.g. bottom side of sensing diaphragm 22) to a second input pressure. In some cases, two protective housings 14 may be attached to the substrate 12 with the same or substantially the same "footprint" on each side, but this is not required.

In the illustrative embodiment, the protective housing 14 may be configured to include an opening 36 for the extender 41 and an inward protrusion body 45 defining a chamber for holding the actuation assembly, namely the spherical object 40 and extender 41, in place. As shown, body 45 is formed as part of the protective housing 14, however, it may be separately formed, as desired. Body 45 may be precisely formed with respect to the dimensions of spherical object 40 so as to maintain a relatively constant point of contact between spherical object 40 and sensing diaphragm 22. Although not necessary, the body 45 may extend all the down to the substrate 12 to help isolate the sensing element 20.

In the illustrative embodiment of FIG. 1, the protective housing 14 may be attached to the package substrate 12 using a suitable adhesive or any other suitable bonding mechanism (e.g. solder, eutectic, etc.). As shown in FIG. 1, the protective housing 14 may define an opening 36 which provides access to the pressure sensing die 22 from the environment external to the protective housing. The opening may be sized according to the extender 41 to maintain the spherical object 40 and extender 41 in a generally upright (in the orientation shown in FIG. 1) orientation.

Although not shown, the sensor assembly 10 may include one or more electrical leads on the substrate 12 that can be electrically connected to the pressure sensing die 20 for receiving one or more signals corresponding to the pressure or force sensed by the sensing die 20 (e.g. sensing diaphragm 22). In some cases, the one or more electrical leads may include metal, however, any suitable material may be used, as desired, such as conductive polymers.

In operation, when a current is applied to the piezoresistive sensing elements (e.g. to the Wheatstone bridge configuration of the piezoresistive sensing elements), an electrical output signal may be generated that is proportional to the degree of deflection of the diaphragm 22 or force applied to the force sensor 10. The actuation assembly may be configured to transmit an external force to the sensing diaphragm 22, thereby deflecting the sensing diaphragm 22 and, changing the resistance of the piezoresistive sensing elements. In some instances, the point of contact between the sensing diaphragm 22 and the spherical object 40 will determine to some extent the amount of output electrical signal, with differing points of contact producing different output signals for the same applied force. By restricting the movement of the spherical object 40 with the body 45 of the housing, and hence the point of contact on the sensing diaphragm 22, increased repeatability of the output electrical signal for a given applied external force can be achieved.

In some applications, by detecting a force, the force sensor 10 may be used to determine the rate of flow of a medium through a tube. For example, the force sensor of FIG. 1 can be used to sense the amount of pressure a medium exerts on the interior walls of a tube, and may output an electrical signal that corresponds to the pressure exerted. The amount of pressure exerted on the inner walls of the tube may correlate to the rate of flow of the medium through the tube. As such, the electrical output of the force sensor 10 can be converted into the flow rate of the medium through the tube.

Figure 2:
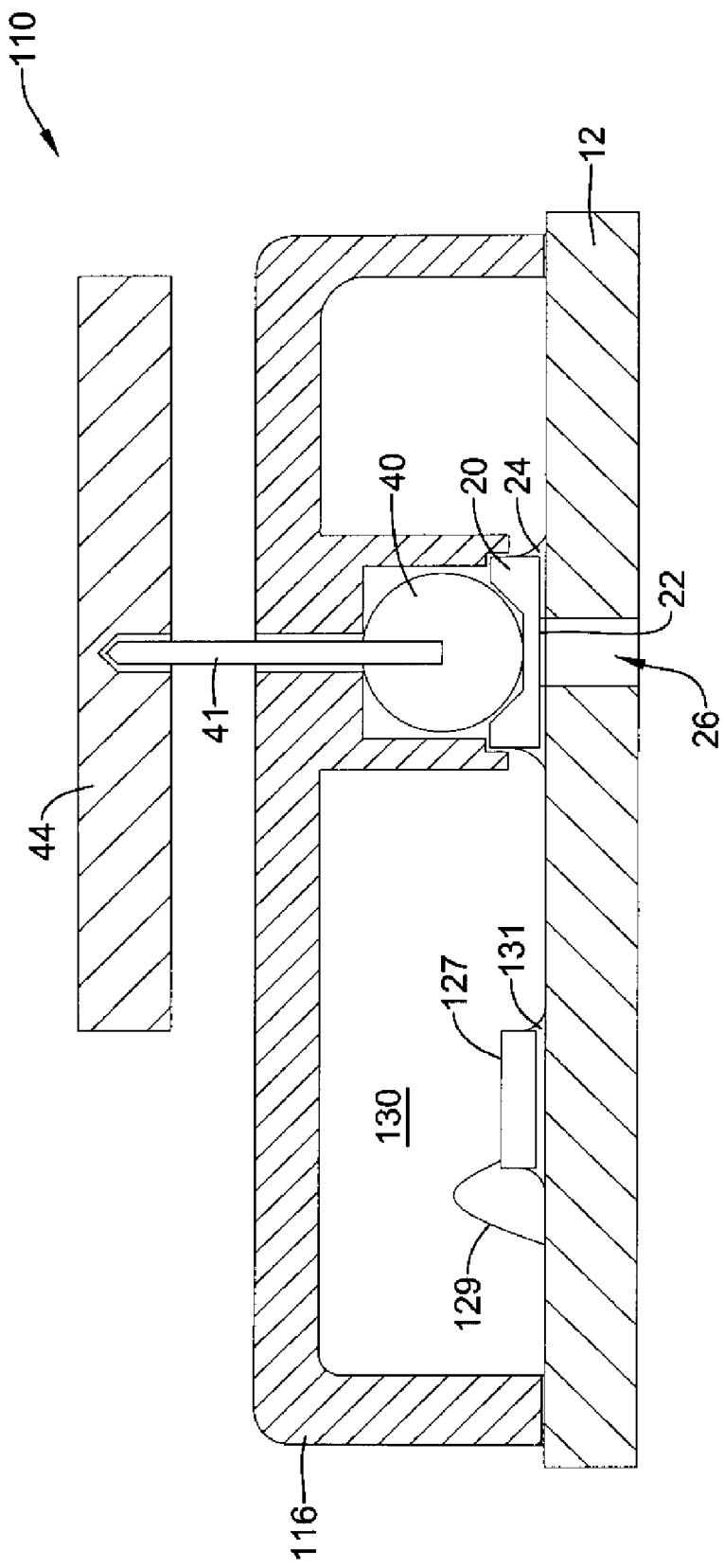
FIG. 2 is a cross-sectional schematic view of an illustrative force sensor that includes signal conditioning circuitry.

FIG. 2 is a cross-sectional view of an illustrative force sensor 110 including signal conditioning circuitry 127. Force sensor 110 may be similar to force sensor 10 shown in FIG. 1, but further includes signal conditioning circuitry 127 mounted on substrate 12. As shown in FIG. 2, the signal conditioning circuitry 127 may be provided on a separate die or other electronics, and may be mounted in cavity 130 formed by protective housing 116. In some cases, the signal conditioning circuitry 127 may include a microprocessor, a microcontroller, and/or an ASIC (Application Specific Integrated Circuit). In some cases, signal conditioning circuitry 127 may be mounted to the substrate 112 using an adhesive 131 or any other suitable bonding mechanism (e.g. solder, eutectic, etc.). As shown, signal conditioning circuitry 127 may be secured to the substrate 12 adjacent to the sensing die 20. The signal conditioning circuitry 127 may be electrically connected to sensing die 20 via trace conductors on the substrate 12, and in some cases, via bond wires 129. Trace conductors on the substrate 12 may be connected to connectors, leads, bond pads or terminals (not shown) of the force sensor 110. In some cases, it is contemplated that signal conditioning circuitry 127 may be electrically connected to the sensing die 20 in other ways, including direct die-to-die wire bonds, if desired.

When provided, the signal conditioning circuitry 127 may include circuitry that receives an output signal from the sensing die 20, and may generate in response an output signal whose magnitude is representative of a magnitude of the force applied to the sensing die 20. The signal conditioning circuitry 127 may condition the output signal of the sensing die to correct for repeatable variations, such as offset, sensitivity, non-linearity, temperature effects, and/or other variations. The signal conditioning circuitry 127 may condition the output signal to compensate for temperature-dependent variations in the electrical characteristic and/or to account for a nonlinear relationship between changes in the electrical characteristic and corresponding changes in the magnitude of the force.

Figure 3:
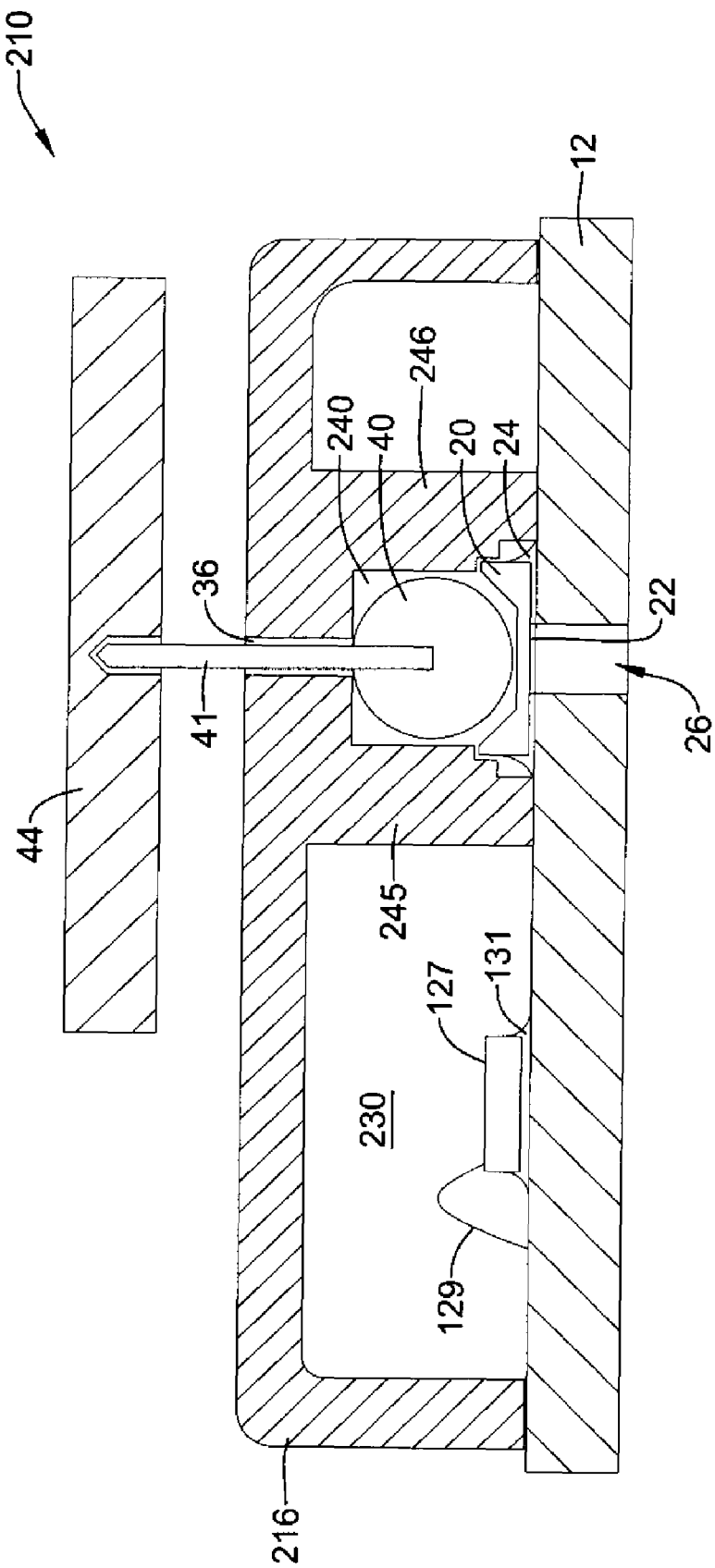
FIG. 3 is a cross-sectional schematic view of another illustrative force sensor that includes signal conditioning circuitry.

FIG. 3 is a cross-sectional view of another illustrative embodiment of a force sensor 210 including signal conditioning circuitry 127. Force sensor 210 may be similar to force sensor 110 shown in FIG. 2 in many respects, but force sensor 210 includes a housing (e.g. protective housing 216) that defines a first cavity 240 and a second cavity 240 for housing the sensing die 20 and signal conditioning circuitry 127, respectively. In the illustrative embodiment, the protective housing 216 may include one or more protrusions 245 and 246 that are configured to engage and/or seal to substrate 12 to isolate cavities 230 and 240 from one another. With such a configuration, the signal conditioning circuitry 127 may be physically isolated from the sensing die 20 to, in some cases, help protect the signal conditioning circuitry from becoming contaminated and/or provide a more robust sensor package.

In the illustrative embodiment, protective housing 216 may be formed or otherwise manufactured to include a recess formed in its underside to define cavity 230 for housing the signal conditioning circuitry 127. The protective housing 216 may also be formed or otherwise manufactured to have a recess and/or protrusions defining cavity 240 for housing the sensing die 20 and actuation assembly. The protrusions, such as 245 and 246, may extend to the substrate 12 and be bonded, secured, and/or sealed thereto. It is contemplated that other manners or techniques for forming cavities 230 and 240 may be used, as desired.

Figure 4:
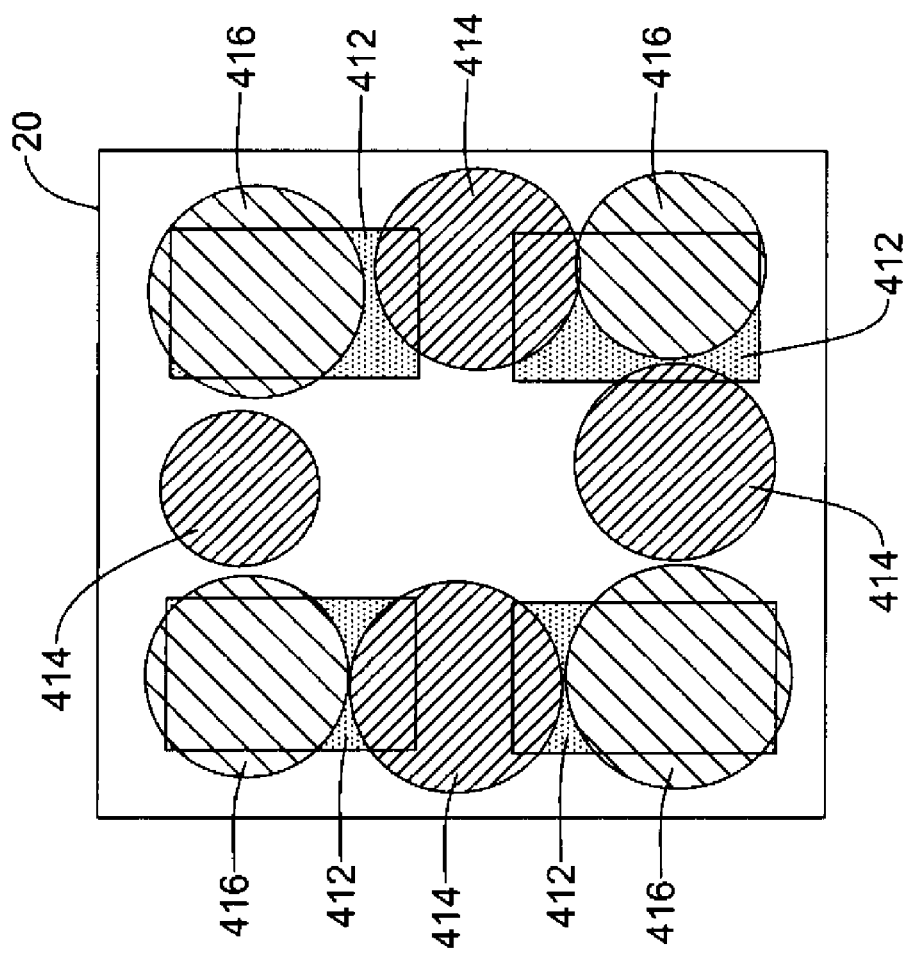
FIG. 4 is a schematic diagram of an illustrative adhesive pattern that may be used to bond a sensing die to a substrate.

FIG. 4 is a schematic diagram of an illustrative adhesive pattern that may be used for bonding the sensing die 20 to the substrate 12. As shown in FIG. 4, the sensing die 20 may be configured to include one or more bond pads 412 for electrical connection to the conductive traces or bond pads on the substrate 12. The bond pads 412 may be electrically connected to the sensing elements (e.g. piezoresistors) and/or other circuitry (e.g. trim, amplification, etc.) on the sensing die 20. As shown, there are four bond pads 412, however, this is merely illustrative and it is contemplated that any suitable number of bond pads 412 may be used, as desired.

In the illustrative embodiment, the adhesive may include a conductive adhesive 416 and nonconductive adhesive 414 patterned to electrically and mechanically attach the sensing die 20 to the substrate 12 (e.g. conductive traces). As shown in FIG. 4, the conductive adhesive 416 and the nonconductive adhesive 414 may be configured in an alternating pattern on the sensing die 20. In this example, the conductive adhesive 416 may be at least partially applied over each or the one or more bond pads 412 to electrically connect the bond pads 412 to the bond pads of the substrate 12. The nonconductive adhesive 414 may be applied between adjacent conductive adhesives 416 to provide electrical isolation between the bond pads. In the illustrated example, with four bond pads 412 being shown, there may be four applications of conductive adhesive 416 (one for each bond pad 412), each separated by nonconductive adhesive 414. This, however, is just one example and it is contemplated that other adhesive patterns and number of applications of conductive and nonconductive adhesive may be used.

In the illustrative embodiment, it is contemplated that any suitable conductive adhesive and nonconductive adhesive may be used. One example nonconductive adhesive is RTV6424, which is available from Momentive Performance Materials Inc. of Waterford, N.Y. One example conductive adhesive is SDC5000, which is available from Momentive Performance Materials Inc. of Waterford, N.Y. These are just examples, and it is contemplated that any other suitable conductive and nonconductive adhesive may be used.

In some embodiments, the conductive and nonconductive adhesives 416 and 414 may be applied at any suitable thickness to mechanically attach the sensing die 20 to the substrate 12. For example, the conductive adhesive 416 and the nonconductive adhesive 414 may have a thickness in the range of about 0.01 millimeters to about 1.0 millimeters, about 0.05 millimeters to about 0.75 millimeters, about 0.05 millimeters to about 0.5 millimeters, about 0.10 millimeters to about 0.25 millimeters, or any other range of thicknesses, as desired.

While FIG. 4 is shown with the conductive adhesive 416 and the nonconductive adhesive 414 applied to the sensing die 20, it is to be understood that the conductive adhesive 416 and the nonconductive adhesive 414 may be applied to the substrate 12 and/or the sensing die 20, if desired. Further, the illustrative pattern of conductive adhesive 416 and the nonconductive adhesive 414 is shown prior to the sensing die 20 mounted to the substrate 12 or, in other words, how the conductive adhesive 416 and nonconductive adhesive 414 may be initially applied. Although not explicitly shown in FIG. 4, in some cases, the non-conductive adhesive and the conductive adhesive overlap one another, or otherwise collectively provide a continuous adhesive pattern around a perimeter of the sensing die 20. This may help provide a seal between the sensing die 20 and the substrate 12 all the way around the perimeter of the sensing die 20, if desired.

Figure 5:
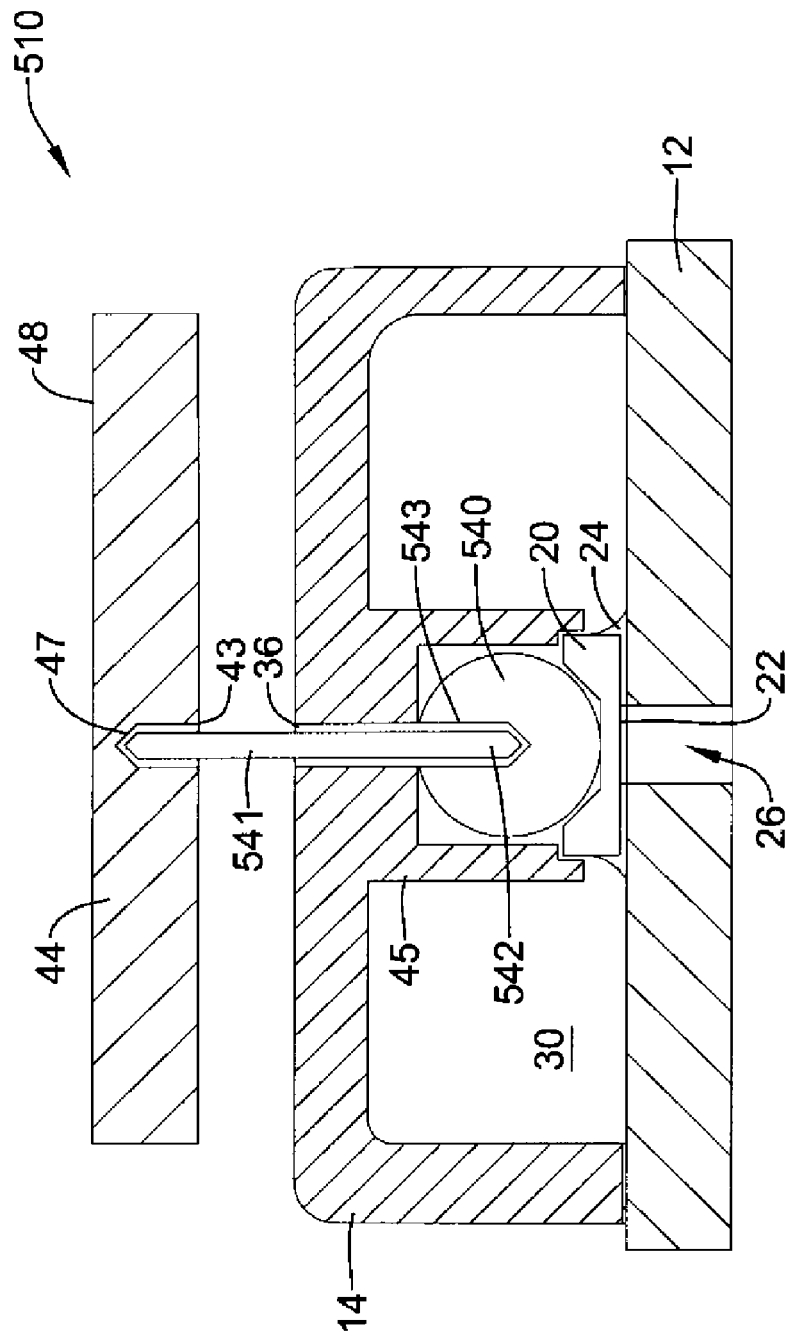
FIG. 5 is a cross-sectional schematic view of another illustrative force sensor.
Figure 6:
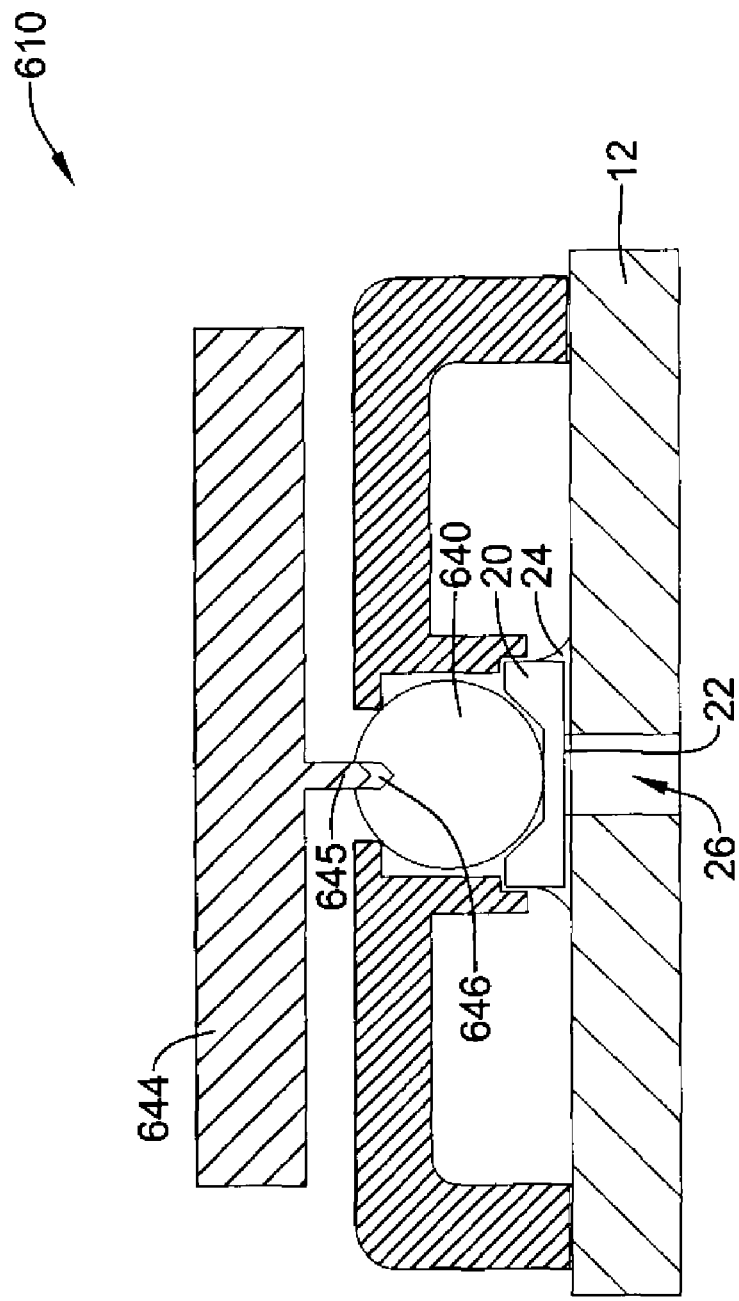
FIG. 6 is a cross-sectional schematic view of another illustrative force sensor.

FIGS. 5 and 6 are cross-sectional schematic views of other illustrative force sensors. As shown in FIG. 5, force sensor 510 may be similar to force sensor 10, but may have an extender 541 having a first end 542 that may be generally conical shaped or otherwise pointed. Generally conical shaped first end 542 may engage a corresponding opening 543 in spherical object 541.

As shown in FIG. 6, force sensor 610 may be similar to the foregoing force sensors, but may have the button 644 directly engaged to spherical object 640 without any extender. In this embodiment, button member 644 may include a protrusion 645 having a generally conical or pointed end that is configured to engage an opening 646 in the spherical object 640. However, it is contemplated that protrusion 645 may be flat or have another shape, as desired. Moreover, it is contemplated that the button 644 may engage the spherical object 640 in any suitable manner including, for example, soldering, adhesively securing, or engaging protrusion 643 to the spherical object 640, press fitting protrusion 645 into a hole formed in the spherical object 640, or any other suitable manner of button member 644 to spherical object 640 with or without protrusion 645.

Although not shown, it is contemplated that force sensors 510 and 610 may include any other feature of the foregoing force sensors. For example, force sensors 510 and 610 may include signal conditioning circuitry, if desired.

Having thus described the preferred embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A force sensor comprising:
   a substrate including a first side and a second side;
   a sensing die including a front side and a back side, wherein the sensing die includes a diaphragm formed by etching the back side of the sensing die and one or more piezoresistive elements positioned on the front side on the diaphragm, wherein the front side of the sensing die is mounted facing the first side of the substrate;
   a housing member positioned on the first side of the substrate, the housing member defining a first cavity around the sensing die, wherein the housing member includes an opening positioned over the sensing die; and
   an actuator assembly including:
      a ball bearing positioned in the first cavity of the housing member and in contact with the back side of the diaphragm;
      a pin member including a first end coupled to the ball bearing and a second end extending through the opening of the housing member; and
      a button member coupled to the second end of the pin member;
   wherein the actuator assembly is configured to transmit a force from the button member to the diaphragm.

2. The force sensor of claim 1, further comprising an adhesive for bonding the front side of the sensing die to the first side of the substrate.

3. The force sensor of claim 2, wherein the front side of the sensing die includes one or more bond pads that are electrically connected to one or more bond pads on the substrate without wire bonds.

4. The force sensor of claim 2, wherein the adhesive includes a pattern of conductive adhesive and nonconductive adhesive.

5. The force sensor of claim 1, wherein the substrate includes a substrate opening extending between the first and second sides of the substrate, wherein the diaphragm is positioned over the substrate opening.

6. The force sensor of claim 1, wherein the ball bearing includes an indentation configured to receive the first end of the pin member.

7. The force sensor of claim 1, wherein the button member includes an indentation configured to receive the second end of the pin member.

8. The force sensor of claim 7, wherein the first end and/or the second end of the pin member is conical in shape.

9. The force sensor of claim 1, further comprising signal conditioning circuitry mounted on the first side of the substrate in electrical communication with the sensing die, wherein the signal conditioning circuitry is configured to receive an electrical output signal from the sensing die and condition the electrical output signal to provide a conditioned output signal from the force sensor.

10. The force sensor of claim 9, wherein housing member defines a first cavity and a second cavity, wherein the sensing die is in the first cavity and the signal conditioning circuitry is in the second cavity.

11. A force sensor comprising:
a substrate including a first side and a second side;
a sensing die mounted on the first side of the substrate, the sensing die including a diaphragm and one or more sensing elements positioned on the diaphragm; and
an actuator assembly configured to transmit an external force to the diaphragm of the sensing die, the actuator assembly including:
a contact member in contact with the diaphragm;
a button member separate from the contact member; and
an extender having a first end engaged to the contact member and a second end engaged to the button member for transmitting the external force applied to the button member to the contact member;
a housing member positioned adjacent the first side of the substrate to form a first cavity around the sensing die and the contact member;
wherein the extender is configured to extend through an opening in the housing member and the button member cannot fit through the opening; and
wherein the sensing die is configured to output an electrical signal indicative of the external force applied to the force sensor.

12. The force sensor of claim 11, further comprising signal conditioning circuitry mounted on the first side of the substrate in electrical communication with the sensing die, wherein the signal conditioning circuitry is configured to receive an electrical output signal from the sensing die, and condition the electrical output signal to provide a conditioned output signal from the force sensor.

13. The force sensor of claim 11, further comprising an adhesive for bonding a front side of the sensing die to the first side of the substrate.

14. The force sensor of claim 13, wherein the adhesive includes a pattern of conductive adhesive and nonconductive adhesive to selectively electrically connect one or more bond pads of the sensing die to one or more bond pads of the substrate.

15. A force sensor comprising:
a substrate including a first side and a second side;
a sensing die mounted on the first side of the substrate, the sensing die including a diaphragm and one or more sensing elements positioned on the diaphragm; and
an actuator assembly configured to transmit an external force to the diaphragm of the sensing die, the actuator assembly including:
a ball bearing in contact with the diaphragm;
a button member separate from the ball bearing; and
an extender having a first end engaging the ball bearing member and a second end engaged to the button member for transmitting the external force applied to the button member to the ball bearing;
the sensing die is configured to output an electrical signal indicative of the external force applied to the force sensor.

16. The force sensor of claim 11, wherein the contact member includes a ball bearing.

17. A method of manufacturing a force sensor comprising:
flip chip mounting a front side of a sensing die to a first side of a substrate, wherein the sensing die includes a diaphragm and one or more sensing elements, wherein the sensing elements are adjacent the front side of the sensing die; and
providing an actuation assembly in contract with a back side of the diaphragm, wherein the actuation assembly is configured to transmit an external force to the diaphragm, the actuation assembly including an object with at least part of its outer surface having a spherical shape in contact with the back side of diaphragm, a pin member having a first end coupled to the object, and a button member coupled to a second end of the pin member.

18. The method of claim 17, further comprising positioning a housing member on the first side of the substrate to form a first cavity around the sensing die and the spherical member, wherein the pin member is configured to extend through an opening in the housing member.

19. The method of claim 17, wherein mounting the front side of the sensing die to the first side of the substrate includes disposing a conductive adhesive and a nonconductive adhesive in a pattern between the substrate and the sensing die.

20. The method of claim 17, further comprising mounting signal conditioning circuitry to the first side of the substrate in electrical communication with the sensing die, wherein the signal conditioning circuitry is configured to receive an electrical signal from the sensing die and condition the signal to provide a conditioned output signal from the force sensor.

21. A force sensor comprising:
a substrate including a first side and a second side;
a sensing die mounted on the first side of the substrate, the sensing die including a diaphragm and one or more sensing elements positioned on the diaphragm; and
an actuator assembly configured to transmit an external force to the diaphragm of the sensing die, the actuator assembly including:
a contact member in contact with the diaphragm; and
a button member engaged to the contact member;
a housing member positioned adjacent the first side of the substrate to form a first cavity around the sensing die and the contact member, wherein the button member is configured to transfer a force applied to the button member to the contact member through an opening in the housing member;
wherein the sensing die is configured to output an electrical signal indicative of the external force applied to the force sensor; and
wherein the contact member and the button member cannot pass through the opening in the housing member.

22. The force sensor of claim 11, wherein the contact member cannot pass through the opening.

* * * * *